(12) United States Patent
Moon et al.

(10) Patent No.: US 11,301,010 B2
(45) Date of Patent: Apr. 12, 2022

(54) HEAT TRANSFER SYSTEMS AND STRUCTURES

(71) Applicant: Nanov Display Inc., Coral Gables, FL (US)

(72) Inventors: Myung Moon, Coral Gables, FL (US); Jin Yang, Coral Gables, FL (US)

(73) Assignee: Myung-Kune Moon, Coral Gables, FL (US)

( * ) Notice: Subject to any disclaimer, the term of this patent is extended or adjusted under 35 U.S.C. 154(b) by 0 days.

(21) Appl. No.: 16/635,836

(22) PCT Filed: Aug. 1, 2018

(86) PCT No.: PCT/IB2018/055790
§ 371 (c)(1),
(2) Date: Jan. 31, 2020

(87) PCT Pub. No.: WO2019/026005
PCT Pub. Date: Feb. 7, 2019

(65) Prior Publication Data
US 2020/0241612 A1 Jul. 30, 2020

Related U.S. Application Data

(60) Provisional application No. 62/539,950, filed on Aug. 1, 2017.

(51) Int. Cl.
*H05K 5/00* (2006.01)
*H05K 7/00* (2006.01)
*G06F 1/16* (2006.01)
*G06F 1/20* (2006.01)
(Continued)

(52) U.S. Cl.
CPC ............ *G06F 1/206* (2013.01); *G06F 1/1601* (2013.01); *G06F 1/1637* (2013.01); *G06F 1/1656* (2013.01); *G06F 1/182* (2013.01); *G06F 1/203* (2013.01); *H05K 7/2039* (2013.01); *H05K 7/20136* (2013.01); *H05K 7/20209* (2013.01); *H05K 7/20336* (2013.01)

(58) Field of Classification Search
CPC ........ G06F 1/203; G06F 1/206; G06F 1/1601; G06F 1/1637; G06F 1/1656; G06F 1/182
See application file for complete search history.

(56) References Cited

U.S. PATENT DOCUMENTS 7,229,683 B2 * 6/2007 Fischer ...................... C09J 7/10
428/293.7
8,120,923 B2 * 2/2012 Cheng ................... G06F 1/1656
361/727

(Continued)

*Primary Examiner* — Anthony M Haughton

(57) ABSTRACT

A display system includes a first enclosure dimensioned to seal within its interior against ingress of dust and water an electronic display device comprising a screen, the first enclosure having a pane for enabling viewing of the screen from the exterior of the first enclosure; and at least one heat transfer structure extending through a wall of the enclosure between the interior and the exterior, each of the at least one heat transfer structure including a heat pipe having a proximal end within the interior of the first enclosure and a distal end at the exterior of the first enclosure. A heat transfer system for transferring heat away from an enclosure is also provided.

30 Claims, 9 Drawing Sheets

(51) Int. Cl.
    *G06F 1/18*  (2006.01)
    *H05K 7/20*  (2006.01)

(56) References Cited

U.S. PATENT DOCUMENTS

| | | | |
|---|---|---|---|
| 8,274,789 B2* | 9/2012 | Nakamichi | H05K 7/20972 361/688 |
| 9,442,513 B2* | 9/2016 | Ecker | G06F 1/1601 |
| 9,622,392 B1* | 4/2017 | Bowers | G06F 1/206 |
| 10,270,918 B2* | 4/2019 | Bowers | G06F 1/263 |
| 10,303,220 B1* | 5/2019 | Murray | G06F 1/186 |
| 10,398,066 B2* | 8/2019 | Dunn | G02F 1/133385 |
| 10,514,722 B1* | 12/2019 | Artwohl | G06F 1/1601 |
| 2012/0223877 A1* | 9/2012 | Cho | G02F 1/133528 345/102 |
| 2017/0192184 A1* | 7/2017 | Kelty | G02B 6/4292 |

\* cited by examiner

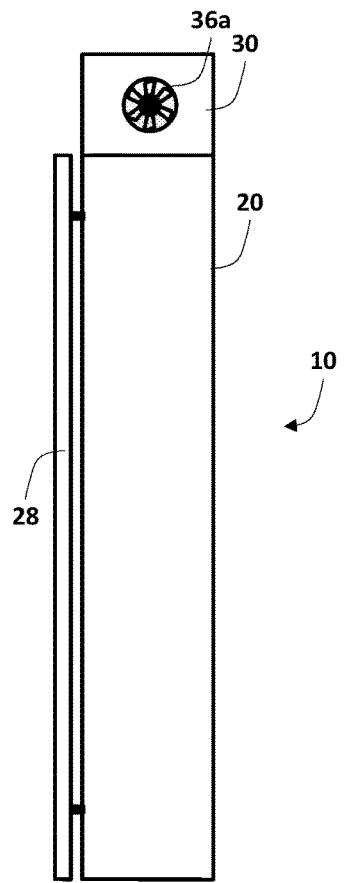 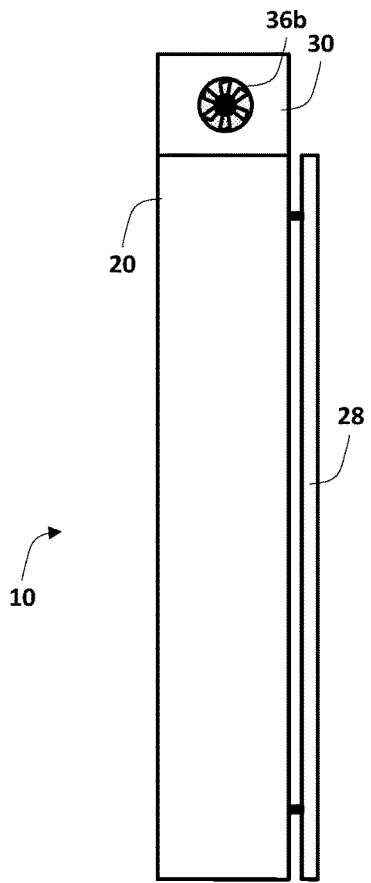
FIG. 4A  FIG. 4B
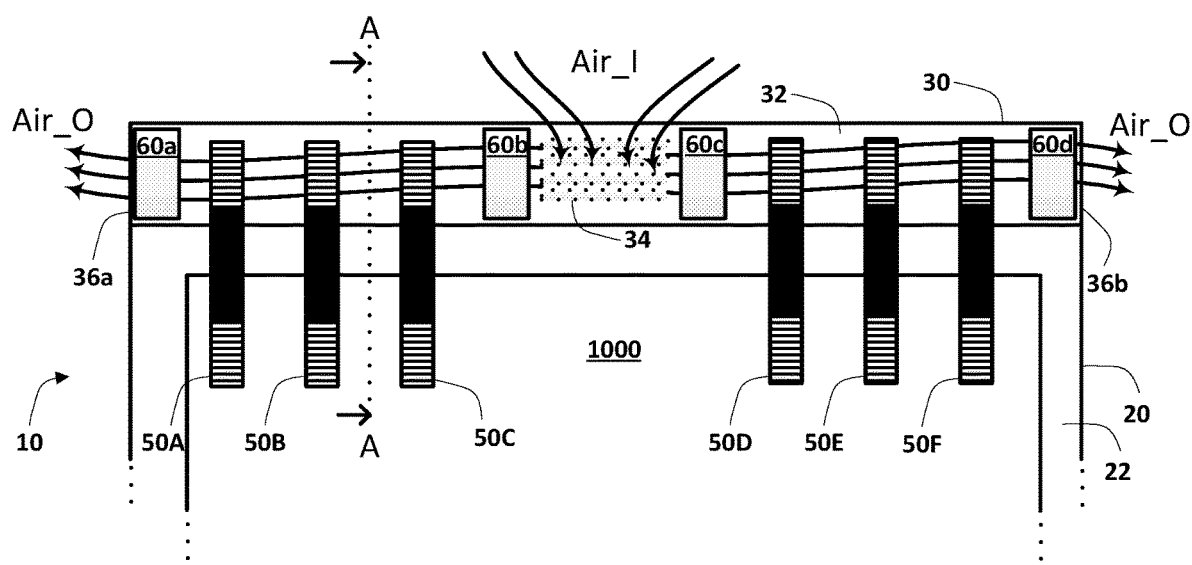
FIG. 5

HEAT TRANSFER SYSTEMS AND STRUCTURES

RELATED APPLICATIONS

The present application is a national phase filing under 35 USC 371 of International Application No. PCT/IB2018/055790, filed on Aug. 1, 2018, claiming priority to U.S. Provisional Patent Application No. 62/539,950, filed on Aug. 1, 2017, the entire contents and disclosures of which are hereby incorporated by reference.

FIELD OF THE INVENTION

The following relates generally to electronic display systems, and more particularly to heat transfer systems and structures for transferring heat out of enclosures containing electronic display systems or other similar heat-generating systems.

BACKGROUND OF THE INVENTION

Electronic display systems of various types are well-known and in wide and varied use for displaying various types of information to observers. Various electronic display systems are known that can be centrally and automatically controlled in order to easily and accurately convey timely information to observers. For example, electronic display systems positioned at train, subway and other travel stations are well known to include screens for displaying timely travel schedules and statuses to commuters.

Whereas the ambient environment—such as the temperature, humidity, moisture, dust, lighting etc.—within an indoor location is typically somewhat controlled to be comfortable for both observers and electronic equipment, often, electronic display systems are required to be deployed in outdoor locations. In outdoor locations the ambient environment cannot as easily be controlled. For example, dust and water may be more prevalent, and their interaction with electrical and electronic components can prevent the proper and effective operation of the systems of which they are a part. The effects of certain environmental hazards may be reduced by protecting such electronic display systems under building overhangs or other shelters. Such sheltering can reduce the amount of rainwater, snow and sunlight that can reach the sensitive electrical and electronic components of which such an electronic display system is comprised. Furthermore, enclosures such as cases specifically dimensioned to contain within their interiors the electronic components and configured to resist ingress of water and dust from the ambient environment while enabling observers to read the information being displayed on a screen of the electronic display device, are known and useful. Such enclosures can also be constructed so as to provide resistance against damage by thieves or vandals, which is useful in unsupervised environments.

Particularly when electronic equipment is encased within an enclosure such as a case, an important design consideration is temperature regulation. Electronic and electrical components such as processors, power transformers, and other components emit heat when powered. Display devices such as LCD screens that are large enough to be seen from a distance are intensely backlit using components that can also emit significant heat. Heat generated within an enclosure of an electronic display device or other heat generating device must be regulated in order to ensure the various electrical and other components can be maintained at reasonable operating temperatures for performance and longevity. Furthermore, like with a hot vehicle, particularly in the outdoors sunlight beating down on an unsheltered enclosure of an electronic display system adds significant additional heat to the enclosure that must be dealt with.

Various temperature regulation techniques are known for enabling devices with electrical and electronic components to operate within reasonable temperature ranges. For example, desktop and laptop computers have components such as heatsinks in contact with higher-temperature devices such as computer processors, and fans within their cases for drawing ambient air over the heatsinks thereby to draw heat away from them. The heated air is then drawn out of porous grills and the like in the body of the computers for dissipation into the ambient environment.

However, in certain environments, such as the outdoors, providing such porous grills and other structures in the electronics enclosures also risks permitting contaminants such dust and/or water to enter the interior of the enclosures and affect the components contained therewithin. While it is known to position air inlets and outlets at selected regions along enclosures to reduce the chance of ingress of water and/or dust, the environmental contaminants, the wind and the weather tend to present challenges.

SUMMARY OF THE INVENTION

In accordance with an aspect, there is provided a display system comprising a first enclosure dimensioned to seal within its interior against ingress of dust and water an electronic display device comprising a screen, the first enclosure having a pane for enabling viewing of the screen from the exterior of the first enclosure; and at least one heat transfer structure extending through a wall of the enclosure between the interior and the exterior, each of the at least one heat transfer structure comprising: a heat pipe having a proximal end within the interior of the first enclosure and a distal end at the exterior of the first enclosure.

Embodiments of systems disclosed herein enable an electronic display device to be effectively sealed within the interior of an enclosure against the potentially-damaging ingress of dust and/or water, while enabling the conveyance of excess heat out of the interior where the electronic components reside, thereby to preserve the longevity and effectiveness of components of the electronic display device.

In an embodiment, at least one of the at least one heat transfer structure further comprises first heatsink structure within the interior of the first enclosure and associated with the proximal end of the heat pipe.

In an embodiment, at least one of the at least one heat transfer structure further comprises second heatsink structure at the exterior of the first enclosure and associated with the distal end of the heat pipe.

In an embodiment, the display system further comprises air flow structure at the exterior of the first enclosure and oriented to direct ambient air along at least the distal end of the heat pipe.

In an embodiment, the display system further comprises a second enclosure adjacent to the first enclosure and dimensioned to enclose at least the air flow structure and the distal end of the at least one heat pipe.

In an embodiment, the second enclosure comprises at least one air inlet through a wall of the second enclosure for receiving the ambient air into the second enclosure; and at least one air outlet, each of the at least one air outlet opposite one or more of the at least one heat transfer structure from the at least one air inlet for expelling received ambient air from the second enclosure.

In an embodiment, the display system comprises a first air outlet at a first end of the second enclosure; and a second air outlet at a second end of the second enclosure that is opposite the first end, wherein the at least one air inlet is intermediate the first and second ends.

In an embodiment, the air flow structure comprises first and second electric fans adjacent to the at least one air inlet and respectively oriented to draw ambient air through the at least one air inlet towards respective ones of the first air outlet and the second air outlet.

In an embodiment, the air flow structure comprises second and third electric fans adjacent to respective ones of the first air outlet and the second air outlet and respectively oriented to draw ambient air through the second enclosure and out of the respective first air outlet and the second air outlet.

In an embodiment, the heat pipe has a flat, rectangular shape.

In an embodiment, the heat pipe comprises a metal container; a wick structure contained within the metal container; and a working fluid contained within the metal container.

In an embodiment, the metal container is an aluminum container. In an embodiment, the working fluid is acetone.

In an embodiment, the first heatsink structure comprises a first set of fins in heat communication with a first region of the proximal end of the heat pipe; and a second set of fins in heat communication with a second region of the proximal end of the heat pipe.

In an embodiment, the second heatsink structure comprises a third set of fins in heat communication with a first region of the distal end of the heat pipe; and a fourth set of fins in heat communication with a second region of the distal end of the heat pipe.

In an embodiment, the first, second, third and fourth set of fins are each in heat communication with respective regions of the heat pipe via a thermal interface material.

In an embodiment, the display system comprises at least a first air inlet on a first side of the second enclosure; and at least a second air inlet on a second side of the second enclosure opposite the first side.

In an embodiment, the display system comprises a plurality of heat transfer structures. In an embodiment, the display system comprises six heat transfer structures.

In an embodiment, the display system comprises a temperature control system in communication with the air flow structure and controlling a speed that ambient air is directed by the air flow structure.

In an embodiment, the temperature control system comprises a control board in communication with at least one temperature sensor within the interior of the first enclosure, wherein the control board comprises processing structure controlling a speed that ambient air is directed by the air flow structure in response at least to temperature measurements by the at least one temperature sensor.

In an embodiment, the temperature control system further comprises at least one heater within the interior of the first enclosure and in communication with the control board, wherein the processing structure also controls actuation of the at least one heater thereby to control temperature within the interior of the first enclosure.

In an embodiment, the display system further comprises processing structure for generating at least one user interface configured to enable communication with the control board from the exterior of the first enclosure for at least instructing the control board to control temperature within the interior of the first enclosure.

In accordance with another aspect, there is provided a heat transfer system for transferring heat away from an enclosure, the heat transfer structure comprising at least one heat transfer structure comprising: a heat pipe having a proximal end and a distal end; first heatsink structure associated with the proximal end of the heat pipe and dimensioned to be enclosed within the enclosure; and second heatsink structure associated with the distal end of the heat pipe.

In an embodiment, the heat transfer system comprises air flow structure oriented to direct air along the second heatsink structure thereby to draw heat away from the second heatsink structure.

In an embodiment, the air flow structure comprises at least one fan.

In an embodiment, the heat pipe has a flat, rectangular shape.

In an embodiment, the heat pipe comprises a metal container; a wick structure contained within the metal container; and a working fluid contained within the metal container.

In an embodiment, the metal container is an aluminum container.

In an embodiment, the working fluid is acetone.

In an embodiment, the first heatsink structure comprises a first set of fins in heat communication with a first region of the proximal end of the heat pipe; and a second set of fins in heat communication with a second region of the proximal end of the heat pipe.

In an embodiment, the second heatsink structure comprises a third set of fins in heat communication with a first region of the distal end of the heat pipe; and a fourth set of fins in heat communication with a second region of the distal end of the heat pipe.

In an embodiment, the first, second, third and fourth set of fins are each in heat communication with respective regions of the heat pipe via a thermal interface material.

In an embodiment, the heat transfer system further comprises a control system in communication with the air flow structure and controlling a speed that ambient air is directed by the air flow structure.

In an embodiment, the control system comprises a control board in communication with at least one temperature sensor associated with an interior of the enclosure, wherein the control board comprises processing structure that controls a speed that ambient air is directed by the air flow structure in response at least to temperature signals provided by the at least one temperature sensor.

Other aspects and advantages will be apparent from the following description and from the drawings.

BRIEF DESCRIPTION OF THE DRAWINGS

Embodiments of the invention will now be described with reference to the appended drawings in which:

FIGS. 4A and 4B are a left side and right side elevation views of the display system of FIG. 1;

FIG. 5 is a partial sectional front elevation view of the display system of FIG. 1;

DETAILED DESCRIPTION

Disclosed herein is a display system that includes a first enclosure dimensioned to seal within its interior against ingress of dust and water an electronic display device comprising a screen, the first enclosure having a pane for enabling viewing of the screen from the exterior of the first enclosure; and at least one heat transfer structure extending through a wall of the enclosure between the interior and the exterior, each of the at least one heat transfer structure comprising: a heat pipe having a proximal end within the interior of the first enclosure and a distal end at the exterior of the first enclosure.

Figure 1:
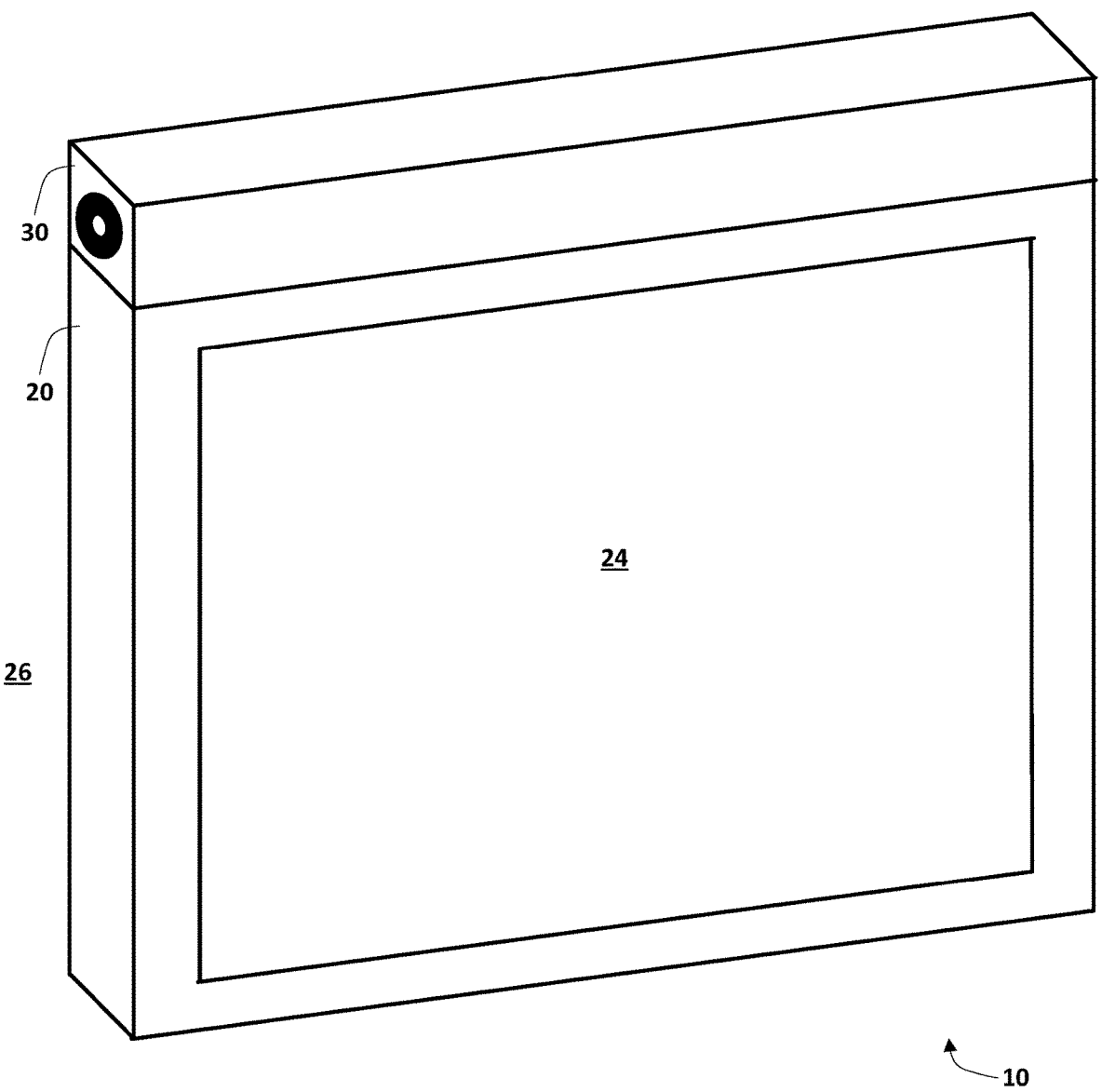
FIG. 1 is a perspective front view of components of a display system, according to an embodiment.

FIG. 1 is a perspective front view of the exterior of a display system 10, according to an embodiment. In this embodiment, display system 10 has a first enclosure 20 for sealing within its interior 22 an electronic display device with a screen (not shown), from ingress of dust and water that may be present at the exterior 26 of the display system 10. In this embodiment, first enclosure 20 has an IP65 enclosure rating. As would be understood, IP65 is a rating defined in International Standard EN 60529: a standard for defining levels of sealing effectiveness of electrical enclosures against ingress of objects, such as dirt and water. IP65 is the rating given for a device that is considered both: protected against dust that may harm equipment, and protected against water spray from all directions. As such, first enclosure 20 provides a very good protection against the ingress of dust and water.

First enclosure 20 also incorporates a clear pane 24 for enabling an observer to see at least the screen of the enclosed electronic display device from exterior 26 of display device 10. In this embodiment, pane 24 is formed from vandal-proof tempered glass and has an applied anti-reflective film. As would be understood, interior 22 of first enclosure 20 may be accessed by authorized personnel in order to install the electronic display device therewithin and, after installation, to perform maintenance as required. For the purposes of this description, the mechanisms by which first enclosure 20 may be opened and re-sealed are generally familiar to the skilled person, and will not therefore be described in particular detail.

In this embodiment, display device 10 further includes a second enclosure 30 that is atop and affixed to an exterior wall of first enclosure 20, for enclosing portions of multiple heat transfer structures and an air flow structure as will be described. While first and second enclosures 20, 30 are physically connected to each other in this embodiment, they are affixed such that there is no passageway provided through which air is intended to freely pass between interiors 22, 32 for the purpose of heat transfer. Small openings may be provided or unavoidable due to the construction of components of first and second enclosures 20, 30, but generally speaking, first enclosure 30 is intended to be sealed against the ingress of dust and water. Second enclosure 30, as will be described, is not as strictly sealed against the ingress of dust and water as is first enclosure 20.

Figure 2:
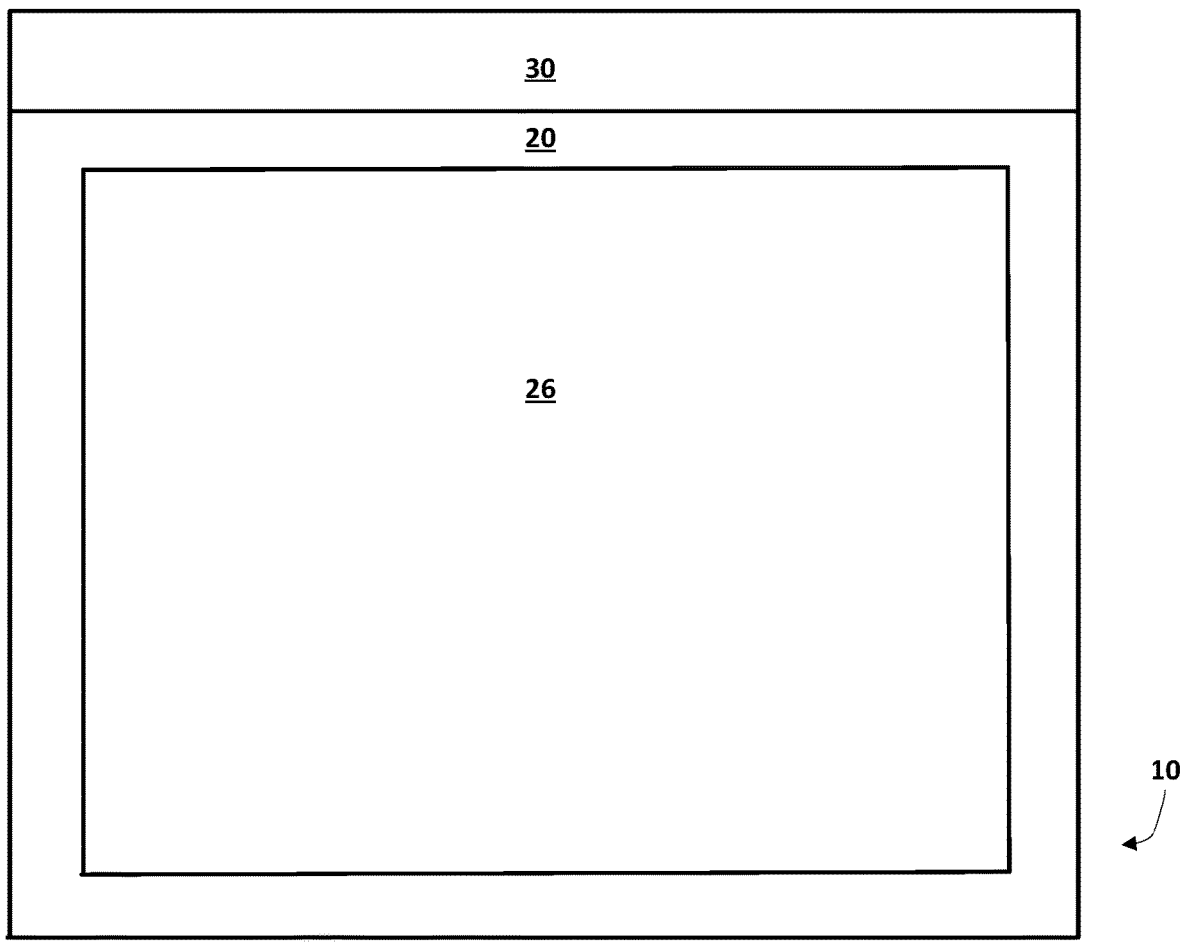
FIG. 2 is a front elevation view of the display system of FIG. 1.
Figure 3:
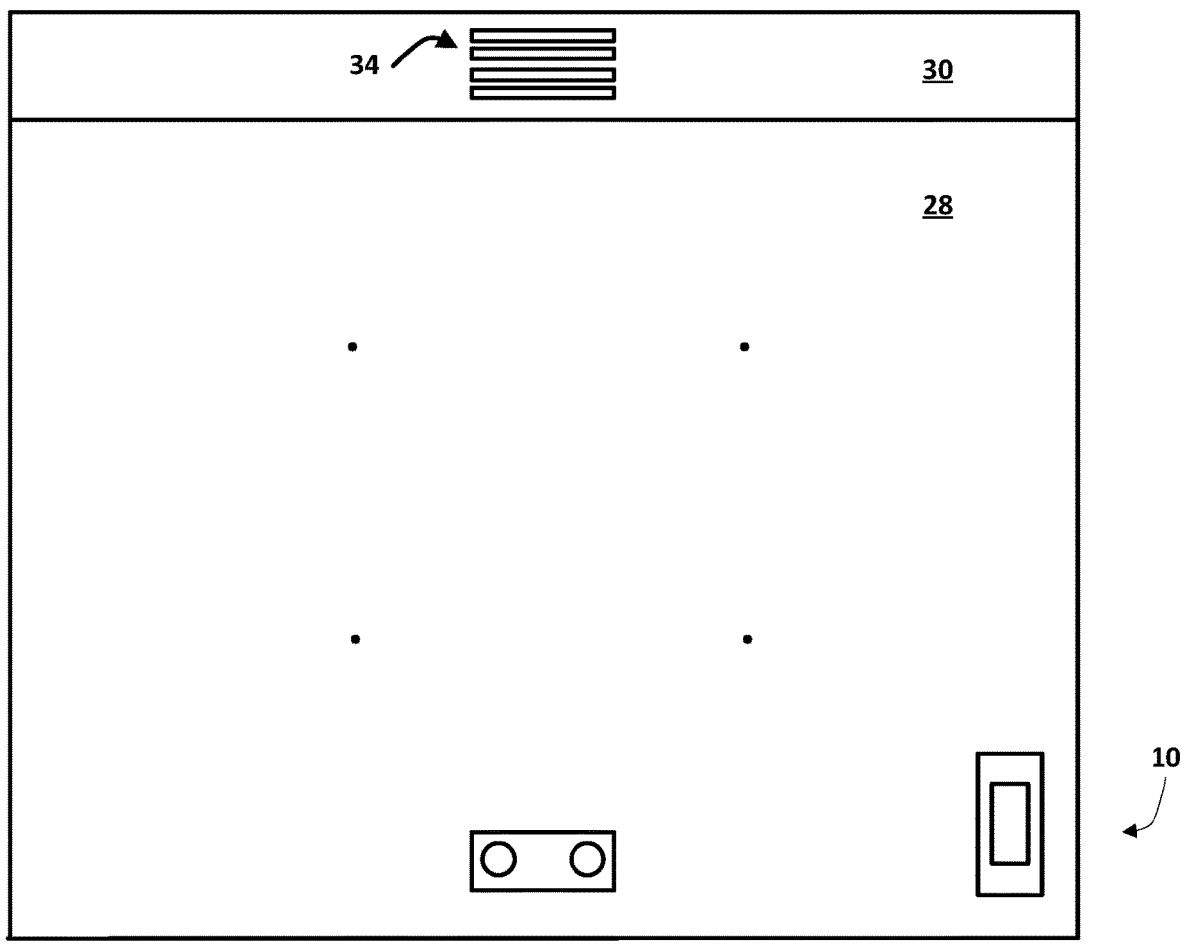
FIG. 3 is a rear elevation view of the display system of FIG. 1.

FIG. 2 is a front elevation view of display system 10, and FIG. 3 is a rear elevation view of display system 10. On this rear side, an air inlet 34 extends from the exterior 26 of display device 10, through an exterior wall of second enclosure 30 at a location intermediate the left and right ends of second enclosure 30, and into an interior 32 of second enclosure 30, so as to receive ambient air into interior 32 of second enclosure 30. In this embodiment, air inlet 34 is in a grill format with the upper edges of individual openings of air inlet 34 overhanging the openings in a known manner thereby to serve somewhat to inhibit moisture from above (rain, snow etc.) entering into the individual openings. A mounting plate 28 is affixed to the rear wall of first enclosure 20 for mounting display device 10 in a known manner. In this embodiment, mounting plate 28 is VESA-compliant thereby to be somewhat universally mountable, as would be understood.

FIG. 4A is a left side elevation view of display system 10, and FIG. 4B is a right side elevation view of display system 10. Two air outlets 36a and 36b extend, on respective sides, from interior 32 of second enclosure 30, through an exterior wall of second enclosure 30, to exterior 26 of display device 10. As will be described, the air flow structure within second enclosure 30 draws ambient air entering air inlet 34 through second enclosure 30 and out of both air outlets 36a and 36b.

FIG. 5 is a partial sectional front elevation view of display system 10, showing components of display system 10 within interiors 22, 30 of enclosures 20, 30, for enabling heat from within interior 22 to be conveyed out of interior 22 and, in this embodiment, into interior 32. Furthermore, components for causing incoming air Air_I to flow through and out of interior 32 as outgoing air Air_O thereby to draw the heat out of interior 32. Electrical and electronic components 1000 are sealed within interior 22 and are powered from external sources via leads/cables which pass from exterior 26 into interior 22 in a manner that prevents undue ingress of dust or water into interior 22. Similarly, communications and/or power conveyed between components 1000 and air flow structure components described below are passed between interior 22 and interior 32 in a manner that prevents undue ingress of dust or water into interior 22.

In this embodiment, six heat transfer structures 50A, 50B, 50C, 50D, 50E, 50F are disposed at spaced locations within display device 10, such that the six heat transfer structures 50A-50F are each mounted to span into and between interiors 22, 32 of first and second enclosures 20, 30. In particular, in this embodiment, each of the six heat transfer structures 50A-50F extends from interior 22 of first enclosure 20, through an exterior wall of first enclosure 20, through an exterior wall of immediately-adjacent second enclosure 30, and into interior 32 of second enclosure 30. The portion of heat transfer structures 50A-50F within interior 32 are also between respective air outlets 36a, 36b and air inlet 34, such that air inlet 34 and air outlets 36a, 36b are on opposite sides of such portions of respective heat transfer structures 50A-50C, and 50D-50F.

Furthermore, in this embodiment, the air flow structure includes four electric fans 60A, 60B, 60C and 60D mounted within interior 32 of second enclosure 30. Each fan 60A-60D is electrically powered as will be described, and is oriented to draw air in a respective direction. For example, when viewed from the perspective shown in FIG. 5, fans 60A and 60B are each oriented to draw ambient air through inlet 34 in a leftward direction, whereas fans 60C and 60D are each oriented to draw ambient air through inlet 34 in a rightward direction.

Figure 6:
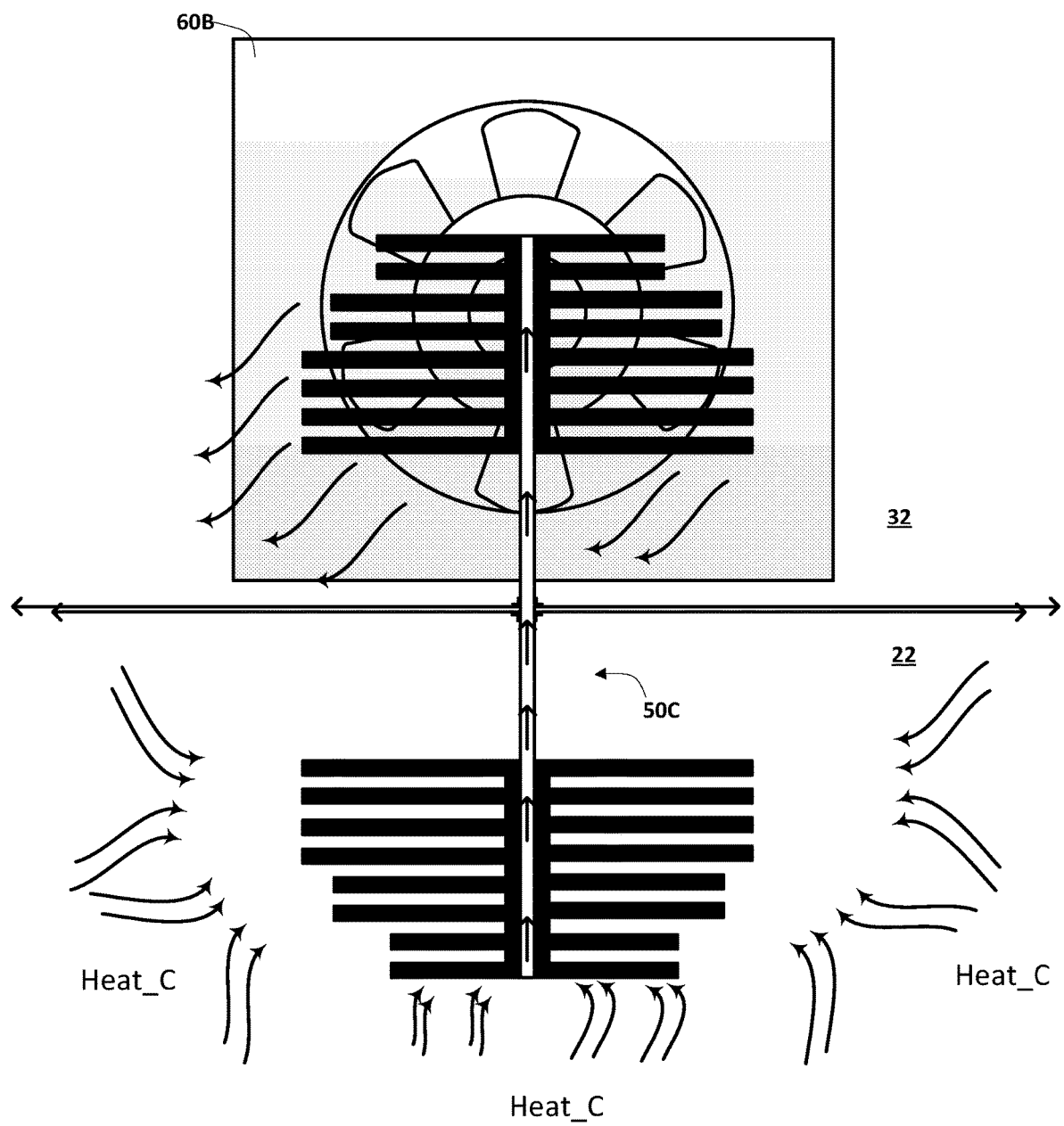
FIG. 6 is an enlarged sectional view of the display system of FIG. 1, seen from the line A-A in FIG. 5, showing a heat transfer structure and portions of an air flow structure.

FIG. 6 is an enlarged sectional view of a portion of display system 10, seen from the line A-A in FIG. 5. This view provides a side view of components of a portion of the air flow structure, in particular fan 60B, and components of heat transfer structure 50C. These components, in combination, enable convective heat energy Heat_C generated by components within interior 22 of first enclosure 20 to be continually transferred to and rapidly conveyed along heat transfer structure 50C out of interior 22 of first enclosure 20. In this embodiment, the heat is conveyed along the heat transfer structure 50C into interior 32 of second enclosure 30. The heat energy reaching interior 32 of second enclosure 30 along heat transfer structure 50C is drawn away from heat transfer structure 50C by air that is, in this embodiment, continually being caused to flow by the air flow structure (fan 60B being a part thereof) from exterior 26 into the interior 32 of second enclosure 30 to and through portions of heat transfer structure 50C that are within interior 32 of second enclosure 30 and out to exterior 26 to be dissipated in the ambient environment. In this way, heat can be captured and transferred out of interior 22 of first enclosure 20 and away from the components of the electronic display device being sealed therewithin, within requiring open inlets and outlets for the free flow of air into, through and out of interior 22 of first enclosure 20.

Figure 7:
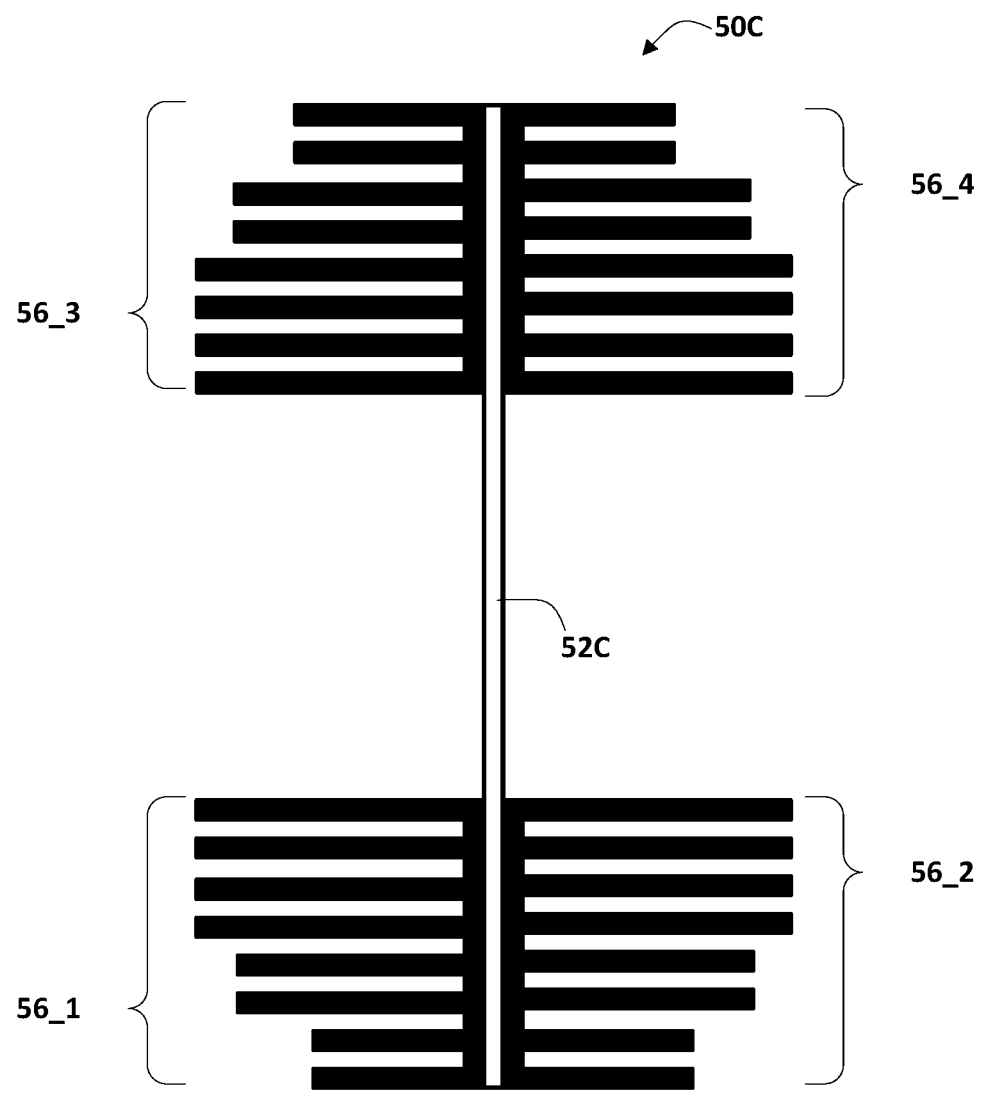
FIG. 7 is a view of the heat transfer structure of FIG. 6, in isolation.

FIG. 7 is a view of heat transfer structure 50C, in isolation. In this embodiment, heat transfer structures 50A, 50B, and 50D to 50F have the same configuration as heat transfer structure 50C. Heat transfer structure 50C includes a heat pipe 52C in contact with first and second heatsink structures. The first heatsink structure is constructed of aluminum and is associated with a proximal end of heat pipe 52C—the end that is positioned within interior 22 of first enclosure 20—and conveys the received heat to heat pipe 52C. In this embodiment, the first heatsink structure includes a first set of fins 56_1 in contact with, via a thermal interface material, a first side (on the left in FIG. 7) of the proximal end of heat pipe 52C. The first heatsink structure also includes a second set of fins 56_2 in contact with, via thermal interface material, a second side (on the right in FIG. 7) of the proximal end of heat pipe 52C.

Similarly, the second heatsink structure is constructed of aluminum and is associated with a distal end of heat pipe 52C—the end that is positioned within interior 32 of second enclosure 30—and conveys the received heat to air being passed along and through the second heatsink structure by the air flow structure within interior 32 of second enclosure 30. In this embodiment, the second heatsink structure includes a third set of fins 56_3 in contact with, via a thermal interface material, a first side (on the left in FIG. 7) of the distal end of heat pipe 52C. The second heatsink structure also includes a fourth set of fins 56_4 in contact with, via thermal interface material, a second side (on the right in FIG. 7) of the distal end of heat pipe 52C. The thermal interface material, or TIM, is a paste-like compound spread between the respective sets of fins and associated regions of heat pipe 52C during assembly to improve the thermal connectivity of the components during operation.

Figure 8:
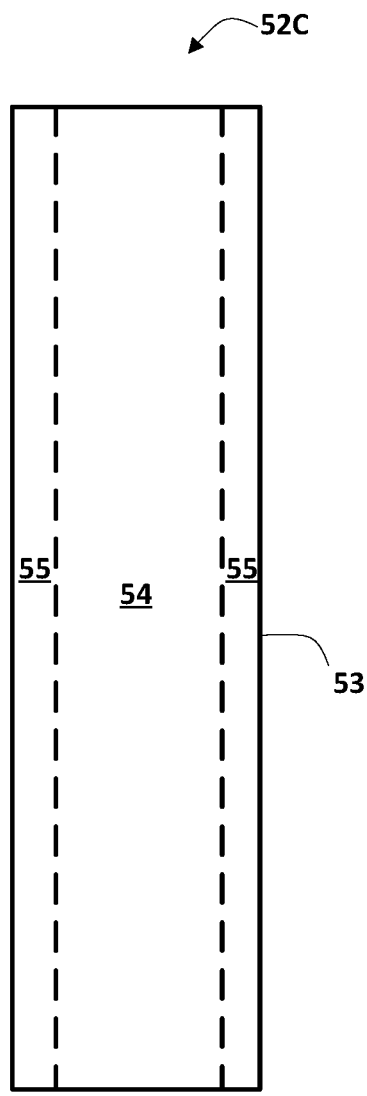
FIG. 8 is a front elevational sectional view of a heat pipe of the heat transfer structure of FIG. 7.

FIG. 8 is a front sectional view of heat pipe 52C. In this embodiment, heat pipe 52C is a MTRAN heat pipe provided by TTM Co., Ltd. of Chungcheongnam-do, Korea. In particular, heat pipe 52C has a flat, rectangular shape providing useful surface area for heat collection and transfer. In this embodiment, heat pipe 52C has a sealed aluminum container 53 that contains both a grooved wick structure 55, and an acetone working fluid 54. The use of a heat pipe such as heat pipe 52C provides a powerful means by which heat can be quickly and efficiently drawn from its proximal end to its distal end, and serves in display device 10 as a useful heat transfer structure that does not require airflow in and out of first enclosure 20. This thin, uniform form factor ensures that heat pipe 52C is somewhat straightforward to pass through close-fitting openings of enclosures 20, 30 during assembly and also straightforward to seal against the openings to prevent undue ingress of dust and/or water into interior 22. In general, heat transferred to the proximal end of aluminum container 53 from interior 22 of first enclosure 20 is, in turn, transferred through the aluminum to the adjacent acetone working fluid 54 contained therein. The acetone working fluid 54 vaporises and in this form travels through the aluminum container 53 towards its relatively cooler end which, in the configuration described herein, is at the distal end within interior 32 of second enclosure 30. At this relatively cooler distal end, the acetone working fluid 54 condenses as the latent heat is drawn through and away from the distal end of aluminum container 53. Condensed acetone working fluid 54 then is drawn back downwards towards the proximal end by capillary action of wick structure 55 to be available to be vaporized again by newly incident latent heat within interior 22. The first heatsink structure at the proximal end of heat pipe 52C provides added surface area for collecting and conveying latent heat from convective air in interior 22 of first enclosure 20 and transferring it to the proximal end of heat pipe 52C. The combination of the air flow structure and the second heatsink structure at the distal end of heat pipe 52C each aid in rapidly providing a pathway for heat thereby cooling the distal end of heat pipe 52C, which in turn assists with the continued condensing of the acetone working fluid 54 at the distal end of heat pipe 52C.

Testing of the heat transfer structure has shown significant heat transfer capabilities in test environments. A test environment was prepared in involving gauging temperatures of a heat transfer structure such as heat transfer structure 50C within and outside of a test cabin (meant to approximate an environment such as that within interior 22 of first enclosure 20) using an infrared camera. Conditions were tested both with and without actuation of air flow structure (a fan) at the distal end of the heat transfer structure, and at three different internal test cabin temperatures (50° C., 85° C., and 95° C.). It was found that, for a test cabin with a default temperature set at about 50° C., without actuation of the fan, the heat transfer structure provided stability of the internal temperature at 50.07° C. With actuation of the fan, the heat transfer structure and fan provided stability of the internal temperature at 31.51° C. This represented an 18.56° C. drop in temperature within the test cabin. It was also found that, for a test cabin with a default temperature set at about 80° C., without actuation of the fan, the heat transfer structure provided stability of the internal temperature at 79.51° C. With actuation of the fan, the heat transfer structure and fan provided stability of the internal temperature at 35.14° C. This represented a 44.37° C. drop in temperature within the test cabin. It was also found that, for a test cabin with a default temperature set at about 95° C., without actuation of the fan, the heat transfer structure provided stability of the internal temperature at 96.83° C. With actuation of the fan, the heat transfer structure and fan provided stability of the internal temperature at 34.10° C. This represented a 62.73° C. drop in temperature within the test cabin. As would be appreciated, the heat transfer structure alone was able to provide stability of heat under these conditions. However, the combination of the heat transfer structure and the actuated air flow structure directing air over the distal heatsink structure of the heat transfer structure provided significant, valuable and stable temperature drop to about 35° C. or below.

Figure 9:
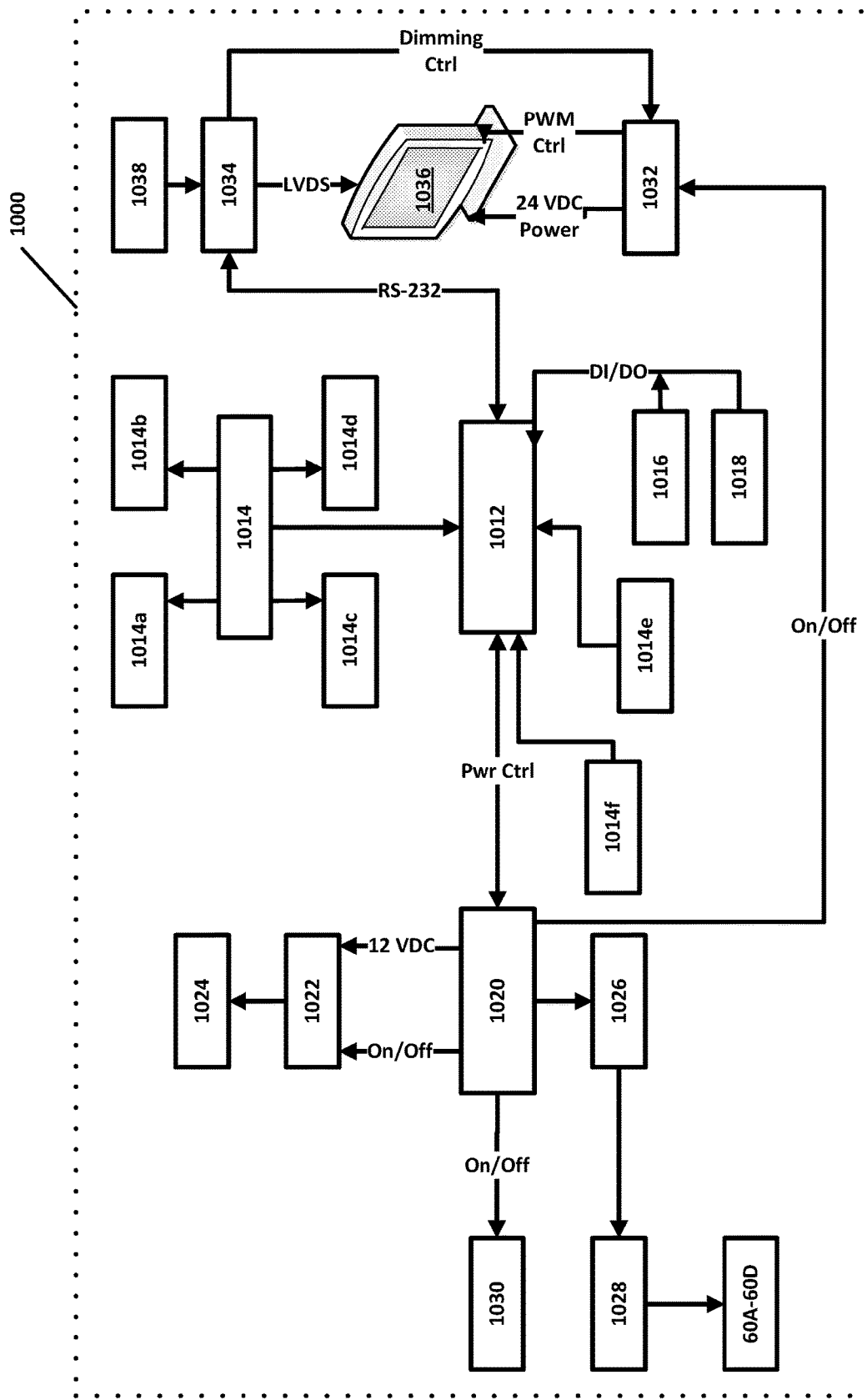
FIG. 9 is a schematic diagram of electrical and electronic components of the display system of FIG. 1, according to an embodiment.

FIG. 9 is a schematic diagram of electrical and electronic components 1000 of display system 10, according to an embodiment. In this embodiment, components 1000 are sealed within interior 22 of first enclosure 20, with the exception of fans 60A-60D, which are located within interior 32 of second enclosure 30 and are in electrical communication with the remainder of components 1000 in interior 22 of first enclosure 20 via electrical leads. Components 1000 include a remote control main board 1012 with electronic components for wirelessly communicating with a remote control (not shown) to enable an authorized user to select menu items as well as video inputs for display on LCD screen 1036, and through the selection of the menu items to assert control over the operation of display system 10, including temperature control. Main board 1012 receives signals from a sensor board 1014 which in turn receives electrical signals from a number of sensor components, including a front sensor 1014a, a brightness sensor 1014b, a first temperature sensor 1014c and a second temperature sensor 1014d. Temperature sensors 1014c and 1014d may be located in different physical locations within interior 22 of first enclosure 20 so as to provide display system 10 with data for gauging temperature at respective locations within interior 22.

Main board 1012 also supports onboard a third temperature sensor 1014e and a humidity sensor 1014f. The temperature sensors 1014c, 1014d and 1014e and humidity sensor 1014f provide temperature and humidity signals to main board 1012, and processing structure on main board 1014 processes the signals to, in turn, direct the air flow structure to increase or decrease air flow, and/or to actuate a heater 1030 via a remote control power board 1020, thereby to serve as a temperature/humidity control system for enabling display device to adapt its operations in response to changes in temperature and humidity within interior 22 of first enclosure 20.

Main board 1012 also receives signals from a door sensor 1018 in order for main board 1012 to react by actuating an audible alarm 1016 in the event that a door of display device 10 has been opened without authorization, or at least to register that the door is opened.

Main board 1012 is in power control communications with remote control power board 1020. Remote control power board 1020 receives power from an external source, such as a 120 VDC standard power supply either directly for transformation (step down, rectification etc.) or via power conditioning circuitry external to display device 10. Remote control power board 1020 distributes power to various components of display system 10, including a fan board 1026 for downstream distribution to fans 60A-60D of the air flow structure via a PWM (pulse width modulation) sub circuit 1028. Power board 1020 also delivers power, when instructed by main board 1012, to heater 1030. In this embodiment, heater 1030 is a 300 Watt heater also located within interior 22 of first enclosure 20 and its actuation is controlled by either supplying or cutting off power from remote control power board 1020 in an On/Off manner. Remote control power board 1020 is also in power and data communications (namely, 12 VDC and On/Off signaling) with a switched mode power supply (SMPS) board 2022 which, in turn, actuates and powers an additional fan board 1024 and any additional fan or fans (not shown). Such an additional fan or fans are, in embodiments, positioned within interior 22 of first enclosure 20 and oriented to circulate air within interior 22 thereby to maintain airflow to avoid any local high temperature areas that may not be sensed by one of the above-described temperature sensors and to push the air, carrying latent heat, into contact with the heat transfer structure so that the heat can be conveyed out as described.

Remote control main board 1012 is also in data communication with an AD board 1034 via an RS-232 serial line connection. In this embodiment, AD board 1034 is an AVR-1004 board available from RPM Systems Corporation of Redmond, Wash., U.S.A. AD board 1034 also receives audio/video signals from a PC computing device (not shown) that is also located within interior 22 of first enclosure 20, and is controlled by remote control main board 1012 to either direct the audio/video to LCD screen 1036 via an LVDS cable (such as for displaying a train schedule on LCD screen 1036) and/or to direct menus or other display screens for user interfaces generated by processing structure supported on main board 1012 on LCD screen 1036 via the LVDS cable. The menu display and power control can alternatively be controlled by a user using on screen display (OSD) buttons supported on OSD board 1038 and also accessible to authorized users. Such OSD buttons may enable the authorized user to switch power to display system 10 On/Off, to control dimming and to trigger the display of, and make selections from, menus.

An SMPS (switched mode power supply) 1032 for LCD screen 1036 is also selectively provided with power by power board 1020, and will deliver PWM control and 24VDC power just to LCD screen 1036. AD Board 1034 is also in direct communications with SMPS 1032 to enable dimming control. In this embodiment, SMPS 1032 is a BRK-6000 set available from Barom Korea.

Temperature control is provided primarily by the processing structure on main board 1012 processing temperature signals from the temperature sensors in order to determine whether the speed of fans 60A-60D can be decreased or should be increased in order to maintain the temperature within interior 22 of first enclosure 20 within desired operating ranges. Similarly, in the event that the temperature control system determines that the temperature within interior 22 of first enclosure 20 should be increased—such as might be the case during a cold winter—the processing structure can actuate heater 1030 thereby to generate auxiliary heat for within interior 22. The processing structure is configured to reduce the heat contributed by heater 1030 in the event that the temperature signals received from the temperature sensors 1014c, 1014d, 1014e indicate the temperature within interior 22 of first enclosure 20 has risen to within an acceptable operating range, thereby to regulate power consumption also.

The user interfaces provided to authorized users permit parameters to be set to establish the desired operating ranges. In embodiments, user interfaces are generated for display either on a remote computer that is in communication with display system 10, or on the screen sealed within the interior 22 of first enclosure 20. The user interfaces enable an authorized user to designate and save a wide range of operating parameters for display system 10, such as parameters for speed and timing of operating of individual ones of fans 60A-60D, similarly for any fans sealed within interior 22, for establishing alarm conditions based on signals provided by the temperature, humidity, door opening and other sensors, for brightness or audio volume of the screen display, and the like. Sensor polling times—the intervals at which the signals from the various sensors are requested and/or acknowledged by the processing structure—may be modified, as can be the input sources for the audio/video signals to the screen. Furthermore, On/Off status of certain components such as the screen, fans, heater and the like, are accessible and modifiable via the user interface. This provides great flexibility for an authorized user to establish the operating conditions for a particular display device 10 depending on the environmental, power consumption and viewability conditions desired for its installation.

Although embodiments have been described with reference to the drawings, those of skill in the art will appreciate that variations and modifications may be made without departing from the spirit, scope and purpose of the invention as defined by the appended claims.

For example, in alternative embodiments, a heat transfer structure or multiple heat transfer structures without respective first and second heatsink structures may be employed for drawing heat out of first enclosure 20, if operating conditions of the electronics and the environment permit. Generally, in high temperature environments or with particularly high heat-emitting electronics, more or larger heat transfer structures are desirable.

Furthermore, a heat transfer structure may have one or the other of the first and second heatsink structures, or may for example due to internal space requirements employ only one set of fins or more than one set of fins or other heatsink structures such as arrays of posts. Variations are possible.

Furthermore, heat transfer structures for a particular display device do not need to be identical. Certain heat transfer structures may be shorter than others, longer than still others, have multiple heat pipes or a single heat pipe, and/or have different heatsink structure form factors. A heat transfer structure may be in contact with a particular component, such as a processor heatsink so as to draw heat directly from the component along a heat pipe as has been described, while still other heat sink structures within a display device may be positioned and configured to receive latent heat from air within its interior. Variations are possible.

Furthermore, if environmental airflow for a particular installation is expected to be sufficient for drawing heat away from the distal end of the heat transfer structure under normal conditions, then an alternative display device may not need to incorporate air flow structure such as fans 60A-60D.

For example, particular voltage/current levels referred to herein may be modified in any manner to provide a functional device 10, as would be understood by a person having ordinary skill in the art.

Figure 10:
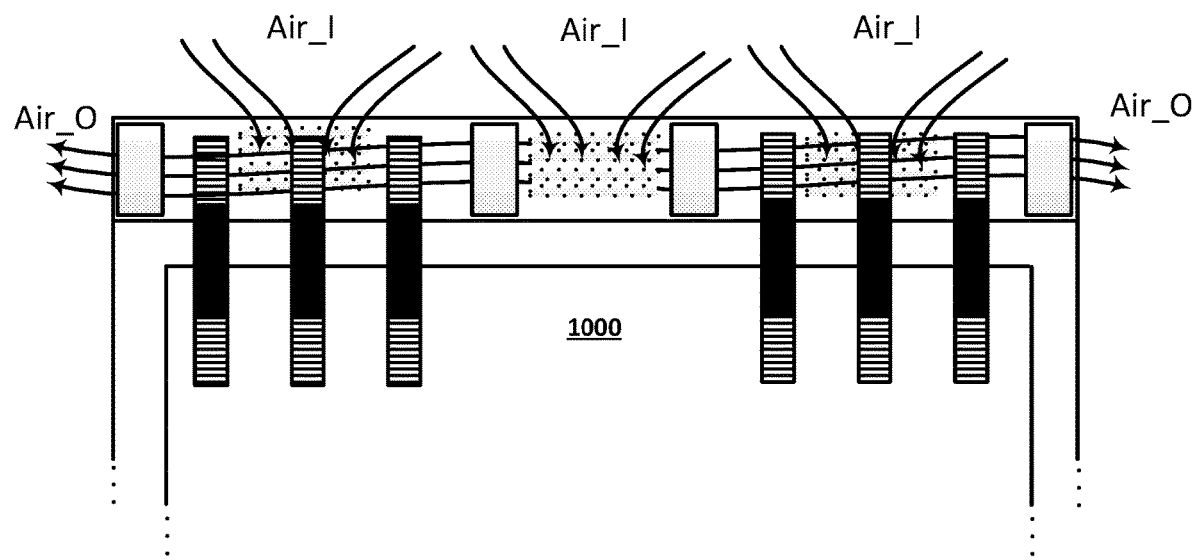
FIG. 10 is a partial sectional front elevation view of a display system, according to an alternative embodiment.

FIG. 10 is a partial sectional front elevation view of an alternative configuration of display system, according to an embodiment. The embodiment shown in FIG. 9 is similar to that shown in FIG. 5, but there are multiple air inlets along the second enclosure to reduce limitations on airflow. In this embodiment, air inlets are positioned on both a first side of the second enclosure and on a second side of the second enclosure opposite the first side. Variations are possible to adapt for various environmental requirements, air flow requirements, and aesthetic requirements.

Figure 11:
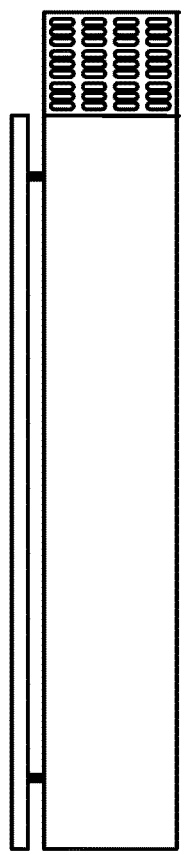
FIG. 11 is a left side elevation view of a display system, according to an alternative embodiment.

FIG. 11 is a left side elevation view of an alternative embodiment of a display system. The embodiment shown in FIG. 11 is similar to that shown in FIG. 4A, with the exception that the air outlets 36a and 36b include grills with individual openings and overhands very similar to those described above in connection with the air inlet 34. Variations are possible to adapt for various environmental requirements, air flow requirements, and aesthetic requirements.

The heat transfer structures disclosure herein may be used as part of other heat transfer systems in other environments for transferring heat out of enclosures, and would provide heat transfer benefit for enclosures that are not necessarily rated as high as, or are rated higher than, IP65. Depending on requirements, such heat transfer systems may also incorporate air flow structure such as that described herein for directing ambient air or other cooling fluid along at least the distal end of the heat pipe and/or the distal heatsink structure, thereby to draw heat away from the heat transfer structure.

What is claimed is:

1. A display system comprising:
a first enclosure dimensioned to seal within its interior against ingress of dust and water an electronic display device comprising a screen,
wherein the first enclosure includes a pane for enabling viewing of the screen from an exterior of the first enclosure;
at least one heat transfer structure extending through a wall of the enclosure between the interior and the exterior, each of the at least one heat transfer structure comprising:
a heat pipe having a proximal end within the interior of the first enclosure and a distal end at the exterior of the first enclosure;
an air flow structure at the exterior of the first enclosure,
wherein the air flow structure is configured to direct ambient air along at least the distal end of the heat pipe;
a control system in communication with the air flow structure,
wherein the control system is configured to control a speed that ambient air is directed by the air flow structure;
a control board in communication with at least one temperature sensor within the interior of the first enclosure,
wherein the control board comprises a processing structure,
wherein the processing structure is configured to control a speed that ambient air is directed by the air flow structure in response at least to temperature signals provided by the at least one temperature sensor.

2. The display system of claim 1, wherein at least one of the at least one heat transfer structure further comprises:
first heatsink structure within the interior of the first enclosure and associated with the proximal end of the heat pipe.

3. The display system of claim 2, wherein at least one of the at least one heat transfer structure further comprises:
a second heatsink structure at the exterior of the first enclosure and associated with the distal end of the heat pipe.

4. The display system of claim 1, further comprising:
a second enclosure adjacent to the first enclosure,
wherein the second enclosure is dimensioned to enclose at least the air flow structure and the distal end of the at least one heat pipe.

5. The display system of claim 4, wherein the second enclosure comprises:
at least one air inlet through a wall of the second enclosure, wherein the at least one air inlet is configured to receive the ambient air into the second enclosure; and
at least one air outlet,
wherein each of the at least one air outlet opposite one or more of the at least one heat transfer structure from the at least one air inlet is configured to expel received ambient air from the second enclosure.

6. The display system of claim 5, comprising:
a first air outlet at a first end of the second enclosure; and
a second air outlet at a second end of the second enclosure that is opposite the first end,
wherein the at least one air inlet is intermediate the first and second ends.

7. The display system of claim 6, wherein the air flow structure comprises:
first and second electric fans adjacent to the at least one air inlet,
wherein the first and second electric fans are respectively configured to draw ambient air through the at least one air inlet towards respective ones of the first air outlet and the second air outlet.

8. The display system of claim 7, wherein the air flow structure comprises:
second and third electric fans adjacent to respective ones of the first air outlet and the second air outlet,
wherein the second and third electric fans are respectively configured to draw ambient air through the second enclosure and out of the respective first air outlet and the second air outlet.

9. The display system of claim 1, wherein the heat pipe has a flat, rectangular shape.

10. The display system of claim 9, wherein the heat pipe comprises:
a metal container;
a wick structure contained within the metal container; and
a working fluid contained within the metal container.

11. The display system of claim 10, wherein the metal container is an aluminum container.

12. The display system of claim 10, wherein the working fluid is acetone.

13. The display system of claim 2, wherein the first heatsink structure comprises:
a first set of fins in heat communication with a first region of the proximal end of the heat pipe; and
a second set of fins in heat communication with a second region of the proximal end of the heat pipe.

14. The display system of claim 3, wherein the second heatsink structure comprises:
a third set of fins in heat communication with a first region of the distal end of the heat pipe; and
a fourth set of fins in heat communication with a second region of the distal end of the heat pipe.

15. The display system of claim 14, wherein the first, second, third and fourth set of fins are each in heat communication with respective regions of the heat pipe via a thermal interface material.

16. The display system of claim 5, comprising:
at least a first air inlet on a first side of the second enclosure; and
at least a second air inlet on a second side of the second enclosure opposite the first side.

17. The display system of claim 1, comprising a plurality of heat transfer structures.

18. The display system of claim 17, comprising six heat transfer structures.

19. The display system of claim 1, wherein the control system further comprises:
at least one heater within the interior of the first enclosure,
wherein the at least one heater is in communication with the control board,
wherein the processing structure is configured to control actuation of the at least one heater to control temperature within the interior of the first enclosure.

20. The display system of claim 19, wherein the control board is in communication with at least one humidity sensor within the interior of the first enclosure, and
wherein the control board comprises a processing structure configured to automatically modify operation of the display device in response at least to humidity signals provided by the at least one humidity sensor.

21. The display system of claim 1, further comprising:
a processing structure configured to generate at least one user interface,
wherein the at least one user interface is configured to enable communication with the control board from the exterior of the first enclosure for at least instructing the control board to control temperature within the interior of the first enclosure.

22. A heat transfer system comprising:
at least one heat transfer structure comprising:
a heat pipe having a proximal end and a distal end;
a first heatsink structure associated with the proximal end of the heat pipe and dimensioned to be enclosed within enclosure;
a second heatsink structure associated with the distal end of the heat pipe,
wherein the heat transfer system is configured to transfer heat away from the enclosure;
an air flow structure configured to direct air along the second heatsink structure to draw heat away from the second heatsink structure;
a control system in communication with the air flow structure,
wherein the control system is configured to control a speed that ambient air is directed by the air flow structure;
wherein the control system comprises:
a control board in communication with at least one temperature sensor associated with an interior of the enclosure,
wherein the control board comprises a processing structure that is configured to control a speed that ambient air is directed by the air flow structure in response at least to temperature signals provided by the at least one temperature sensor.

23. The heat transfer system of claim 22, wherein the air flow structure comprises at least one fan.

24. The heat transfer system claim 22, wherein the heat pipe has a flat, rectangular shape.

25. The heat transfer system of claim 24, wherein the heat pipe comprises:
a metal container;
a wick structure contained within the metal container; and
a working fluid contained within the metal container.

26. The heat transfer system of claim 25, wherein the metal container is an aluminum container.

27. The heat transfer system of claim 25, wherein the working fluid is acetone.

28. The heat transfer system of claim 22, wherein the first heatsink structure comprises:
a first set of fins in heat communication with a first region of the proximal end of the heat pipe; and a second set of fins in heat communication with a second region of the proximal end of the heat pipe.

29. The heat transfer system of claim 28, wherein the second heatsink structure comprises:
a third set of fins in heat communication with a first region of the distal end of the heat pipe; and
a fourth set of fins in heat communication with a second region of the distal end of the heat pipe.

30. The heat transfer system of claim 29, wherein the first, second, third and fourth set of fins are each in heat communication with respective regions of the heat pipe via a thermal interface material.

\* \* \* \* \*